United States Patent [19]
Fujiyama et al.

[11] Patent Number: 6,139,630
[45] Date of Patent: Oct. 31, 2000

[54] SUSPENDER FOR POLYCRYSTALLINE MATERIAL RODS

[75] Inventors: Tatsuhiro Fujiyama; Hiroshi Inagaki, both of Hiratsuka; Teruhiko Uchiyama; Hidetoshi Kurogi, both of Omura, all of Japan

[73] Assignee: Komatsu Electronic Metals Co., Ltd., Kanagawa, Japan

[21] Appl. No.: 08/648,812

[22] Filed: May 16, 1996

[51] Int. Cl.[7] .................................................. C30B 35/00
[52] U.S. Cl. ............................ 117/200; 117/218; 117/918
[58] Field of Search .................................. 117/200, 218, 117/900, 918; 414/908, 910, 911

[56] References Cited

U.S. PATENT DOCUMENTS

| | | | |
|---|---|---|---|
| 3,522,014 | 7/1970 | Keller | 117/218 |
| 3,953,281 | 4/1976 | Pantusco et al. | 117/218 |
| 5,169,271 | 12/1992 | Yamashita | 414/27 |
| 5,173,270 | 12/1992 | Kida et al. | 117/218 |

*Primary Examiner*—Felisa Garrett
*Attorney, Agent, or Firm*—Welsh & Katz, Ltd.

[57] ABSTRACT

A suspender for suspending polycrystalline rods steadfastly and easily in a furnace for single-crystal fabrication by the recharge or additionally charged method is disclosed. The suspender includes a plate which is made of molybdenum or SiC-coated graphite and a stick perpendicularly connected to the center of the plate. Both sides of the openings are arms for supporting the polycrystalline rods, thereby suspending the polycrystalline rods vertically in the opening. Means for preventing the polycrystalline rods from slipping out of the suspender are provided at ends of the arms. Therefore, the polycrystalline rods will not slip from the opening even though the plate is inclined. The suspender is suspended in the furnace by a stick. The polycrystalline rods require few tasks to form grooves and install on the suspender, thus decreasing the process time and manufacturing cost.

3 Claims, 4 Drawing Sheets

SUSPENDER FOR POLYCRYSTALLINE MATERIAL RODS

BACKGROUND OF THE INVENTION

1. Field of the Invention

The present invention relates to a suspender for fabricating single-crystal semiconductors, and more specifically, to a suspender for suspending a polycrystalline material in a chamber of crystal growing apparatus for feeding the crucible with the polycrystalline material as a raw material in fabrication of the single-crystal semiconductors.

2. Description of Prior Art

Single-crystal silicon is utilized as a substrate material for a semiconductor device. One well known method for fabricating single-crystal silicon, the Czochralski (CZ) method, involves pulling a cylindrical single-crystal silicon rod from melted material (melt) in a crucible. In the CZ method, the polysilicon material is charged into the crucible and is melted by a heater around the crucible. A single-crystal seed, which is fixed on a seed holder, is immersed in the melt. When the seed holder rises from the melt and rotates in the same direction or in the opposite direction as the rotation direction of the crucible, the single-crystal silicon rod is formed on the seed.

In recent years, as the diameter of the semiconductor wafer has increased, wafers with diameters of more than six inches have been widely utilized and are becoming well known in the semiconductor industry. Accordingly, the dimensions of the crystal growing apparatus for fabricating the single-crystal silicon must be expanded, and the amount of the single-crystal products increased. However, as the crystal growing apparatus is enlarged and the amount increased, the time required to produce the single-crystal has also increased. Moreover, after the removal of the single-crystal product from the chamber, the fabricating suspender, the crucible and the heaters require a longer cooling time to attain a temperature suitable for cleaning. Therefore, the manufacturing efficiency of the single-crystal silicon is affected.

In order to prevent any diminution of manufacturing efficiency, a recharge method has been provided. The recharge method charges polycrystalline material into the crucible repeatedly after the single-crystal silicon has been pulled. Therefore, the single-crystal manufacturing process can be repeated to avoid the frequent cooling and cleaning tasks of the furnace, thus increasing efficiency. On the other hand, several single-crystal rods instead of only one can be pulled from one crucible to reduce manufacturing costs. Moreover, in order to pull a long single-crystal rod with a large diameter from the crucible, supplementary polycrystalline material should be charged in the melt after the initially charged material has been melted and the rod is about to be pulled. That is, an additionally charged method should be utilized.

The polycrystalline material utilized in the recharge method or the additionally charged method are polycrystalline rods. Each of the polycrystalline rods, as illustrated in FIG. 8, has a body 2 on top of which a ring-shaped groove 2b and two small openings 2c are formed. Referring to FIG. 9, each polycrystalline rod is suspended on an arm 4a of suspending means 4 by a tantalum wire fixed on ring-shaped groove 2b through openings 2c. When suspending means 4 is lowered slowly, the polycrystalline rods will be melted by main heaters around the crucible or by sub-heaters and main heaters over the crucible, thereby providing the melt in the crucible.

However, several problems exist in the aforementioned suspender for suspending the polycrystalline rods. The problems include:

1. The polycrystalline rods require further tasks to form the ring-shaped grooves and the openings, thus increasing the manufacturing cost;
2. In order to suspend the polycrystalline rods on the suspending means, wires (such as tantalum wires) must be utilized, thus further increasing the cost;
3. More tasks and time are required to fasten the polycrystalline rods on the suspending means by the wires;
4. The polycrystalline rods may be contaminated by the wires; and
5. The polycrystalline rods may drop into the crucible if the wires break or are not properly fixed on the polycrystalline rods.

SUMMARY OF THE INVENTION

Accordingly, the present invention provides a suspender for suspending the polycrystalline rods steadfastly in the chamber. The polycrystalline rods, whose structures have been slightly modified, can be easily suspended on the suspender of the present invention even when the recharge or additionally charged methods are utilized.

The suspender of the present invention can be utilized to suspend polycrystalline rods in a chamber for single-crystal fabrication by the CZ method. The suspender slowly lowers the polycrystalline rods into a crucible whereby the polycrystalline rods are melted as raw material. The suspender has a plate over which a plurality of openings are provided for accepting grooves or projections on the top portion of the polycrystalline rods. Therefore, the polycrystalline rods are vertically suspended in the chamber. The suspender further comprises small lugs projecting upwardly at the end portions of both sides of the openings.

In addition, both sides of the openings, which are provided for supporting the polycrystalline rods, have convex top surfaces.

In the aforementioned structure, since a number of openings are formed in the plate of the suspender for suspending polycrystalline rods, and the polycrystalline rods can be vertically suspended on the suspender by engaging the grooves or the projections to the openings. Therefore, the present invention needs no wire for fastening the polycrystalline rods such as that utilized in the conventional suspender. The rods can be steadfastly and easily suspended in the chamber to be melted by the recharge or additionally charged method. Moreover, the lugs at the end portions of the openings can prevent the polycrystalline rods from slipping out of the opening even though the suspender is tilted. Furthermore, since both sides of the openings have upwardly convex top surfaces to contact with the grooves or projections, the polycrystalline rods can be vertically supported when the suspender is slightly inclined.

DETAILED DESCRIPTION OF THE INVENTION

Other objects, features, and advantages of the present invention will become apparent from the following detailed description of the preferred embodiment.

Figure 1:
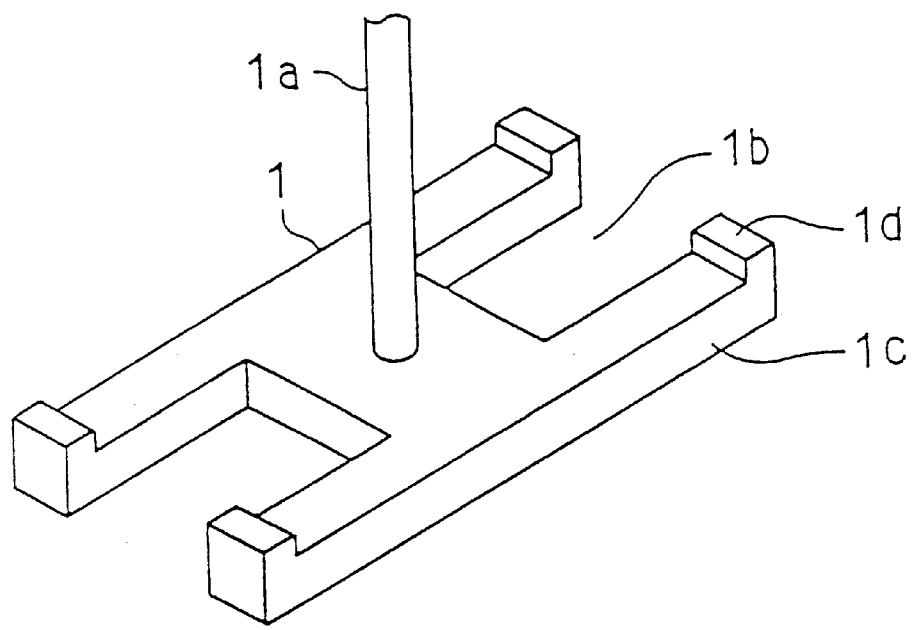
FIG. 1 illustrates a suspender for suspending polycrystalline rods according to a first embodiment of the invention.

The suspender for suspending polycrystalline rods according to the first embodiment of the present invention is illustrated in FIG. 1. Two polycrystalline rods can be suspended on the suspender. The suspender consists of a rectangular plate, which is made of molybdenum or SiC-coated graphite, and a stick 1a perpendicularly connected to the center of the plate. The plate is substantially H-shaped as two openings 1b are formed at opposite sides thereof. Lugs 1d are provided at end portions of two sides of openings 1b, i.e., at ends of arms 1c. Lugs 1d can prevent the polycrystalline rods from running away from the suspender. The suspender is suspended in the chamber by stick 1a.

Figure 2A:
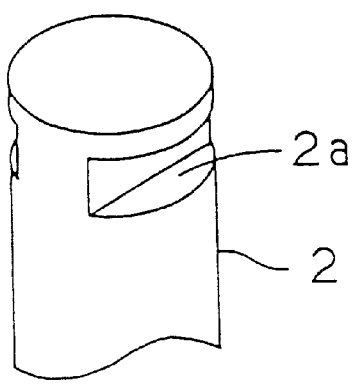
FIG. 2A and FIG. 2B illustrate the top portions of the polycrystalline rods utilized in the present invention.
Figure 2B:
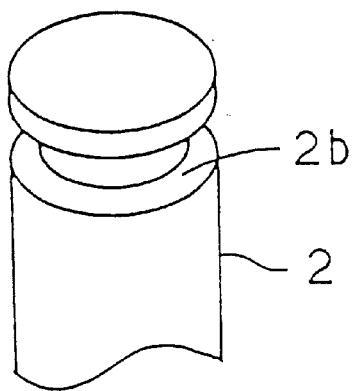

FIG. 2A and FIG. 2B illustrate the top portions of two polycrystalline rods which are designed for the present invention. The polycrystalline rod in FIG. 2A has two parallel straight grooves 2a at opposite sides of the rod axis, while that in FIG. 2B has a ring-shaped groove 2b around the rod. In order to suspend the polycrystalline rods of FIG. 2A and FIG. 2B on the suspender of the present invention, the distance between the parallel straight grooves 2a and the diameter of the ring-shaped groove 2b must be smaller than the distance between the arms 1c of the suspender illustrated in FIG. 1.

Figure 3:
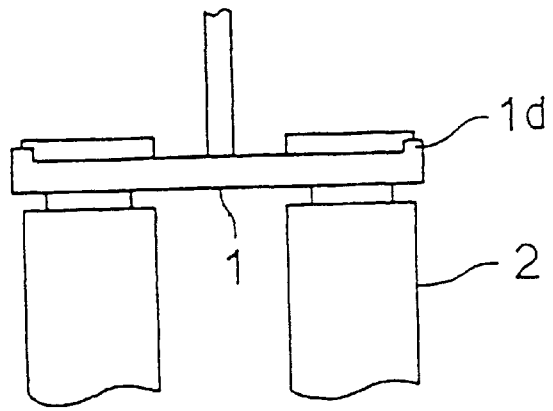
FIG. 3 is a schematic diagram illustrating the polycrystalline rods suspended on the suspender of FIG. 1.

FIG. 3 is a schematic diagram illustrating two polycrystalline rods suspended on the suspender of the present invention. The polycrystalline rods are vertically suspended. Since the polycrystalline rods are secured by lugs 1d, they will not slip from the suspender even when the suspender is tilted.

Figure 4:
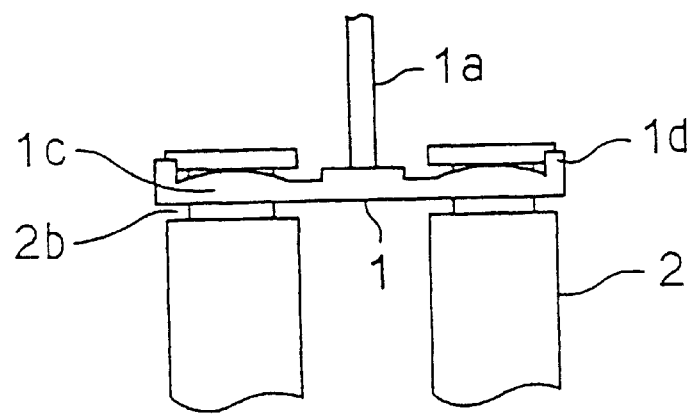
FIG. 4 illustrates the suspender for suspending polycrystalline rods according to a second embodiment of the invention.

The polycrystalline rods, suspended on the suspender according to a second embodiment of the invention, are illustrated in FIG. 4. Except for both sides of the openings, i.e., arms 1c, having convex top surfaces, the suspender in FIG. 4 is the same as FIG. 1. When the polycrystalline rods are accepted by the openings, the upper groove walls of the polycrystalline rods contact the convex top surfaces of the arms. Therefore, if the suspender is inclined, the contact position of the rod and the arm will move away to keep the axis of the polycrystalline rods vertical. Moreover, since the end portions of the arms 1c are provided with lugs 1d, the polycrystalline rods will not slip from the openings. The suspender can be freely attached to the lower end of the stick 1a.

Figure 5:
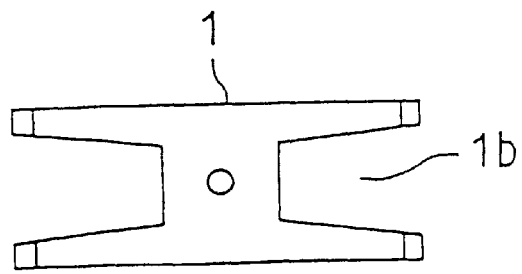
FIG. 5 is the top view of the suspender for suspending polycrystalline rods according to a third embodiment of the invention.
Figure 6:
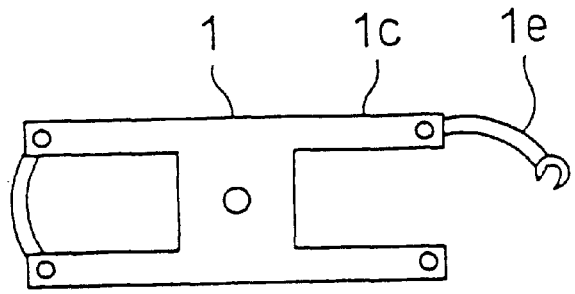
FIG. 6 is the top view of the suspender for suspending polycrystalline rods according to a fourth embodiment of the invention.

A third embodiment of the present invention is illustrated in FIG. 5. The suspender in FIG. 5 has taper-shaped openings 1b to accept polycrystalline rods having a slight variation in diameters. In another embodiment of the present invention, referring to FIG. 6, the suspender is provided with fasteners le instead of the lugs on the end portions. Since the polycrystalline rods are completely confined in the openings when fasteners 1e are locked, the rods will not slip from the suspender.

Figure 7A:
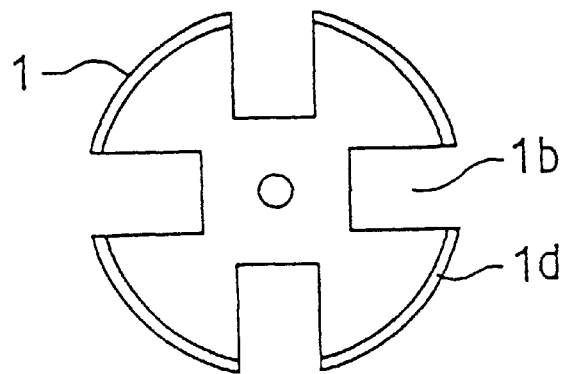
FIG. 7A and FIG. 7B are top views of the suspender for suspending polycrystalline rods according to a fifth embodiment of the invention, wherein a round plate is utilized in FIG. 7A and a rectangular plate is utilized in FIG. 7B.
Figure 7B:
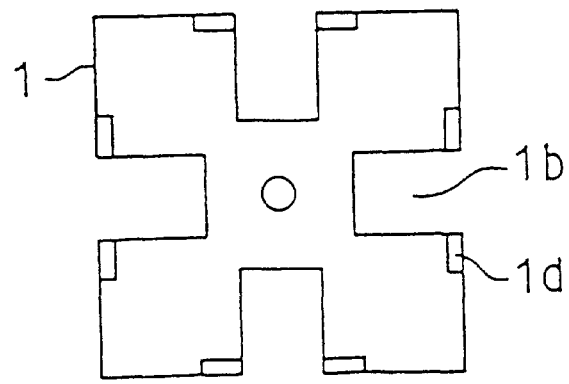
Figure 8:
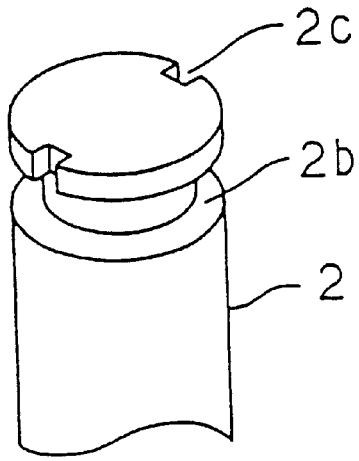
FIG. 8 illustrates the top portion of the polycrystalline rod utilized in a conventional suspending means.
Figure 9:
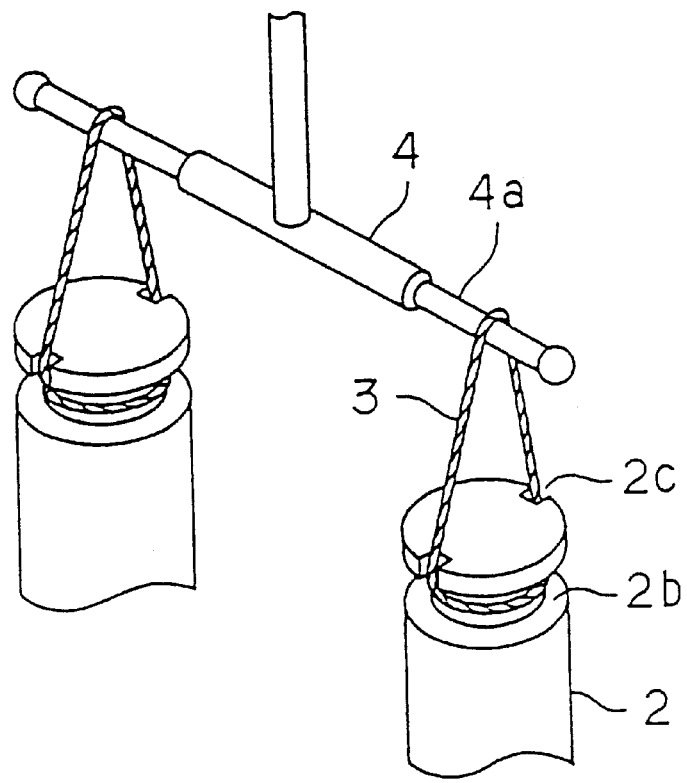
FIG. 9 is a schematic diagram illustrating two polycrystalline rods of FIG. 8 suspended on a conventional suspending means.

The suspender for suspending polycrystalline rods of the present invention can have more than two openings. For example, referring to FIG. 7A, the suspender 1 consists of a round plate on which four radial openings 1b are formed to accept the polycrystalline rods. In FIG. 7B the rectangular plate, as the suspender 1, is also provided with a number of openings 1b. Each of the apparatus illustrated in FIG. 7A and FIG. 7B can support at most four polycrystalline rods. Means for fastening the polycrystalline rods in the openings can also be provided. For example, the fasteners shown in FIG. 6 can be utilized. Moreover, the structures of lugs 1d illustrated in FIG. 1, FIG. 5 and FIGS. 7A and 7B are only for example and can be modified as desired. On the other hand, projections can be formed on the top portion of each polycrystalline rod instead of the parallel grooves or the ring-shaped groove illustrated in FIG. 2A and FIG. 2B.

As described above, the suspender of the present invention has a plate over which a number of openings are formed. The grooves or projections on top portions of the polycrystalline rods can be engaged in the openings, thus vertically suspending the rods on the suspender. The present invention has the following advantages:

1. Simple tasks are required to form grooves or projections on top portions of the polycrystalline rods, thus decreasing the processing time and reducing manufacturing cost;
2. As no tantalum wire is utilized for fastening the polycrystalline rods, the manufacturing cost can be further reduced;
3. Since the polycrystalline rods can be easily installed on the suspender, the time required for each process cycle can be shortened and the polycrystalline rods will not be contaminated; and
4. Means for preventing the polycrystalline rods from slipping out of the openings are provided, therefore the polycrystalline rods will not drop into the crucible, thus maintaining safety.

What is claimed is:

1. A suspender for suspending polycrystalline rods in a single-crystal fabrication mechanism by the Czochralski (CZ) method, the suspender lowering the polycrystalline rods into a crucible whereby the polycrystalline rods are melted as a raw material, said suspender comprising:
    a plate, and
    a plurality of openings on the plate for engaging grooves or projections on top portions of the polycrystalline rods,
    thereby suspending the polycrystalline rods vertically on the suspender.
2. The suspender for suspending polycrystalline rods as claimed in claim 1, further comprising lugs projecting upwardly on end portions of two sides of the openings.
3. The suspender for suspending polycrystalline rods as claimed in claim 1, wherein both sides of the openings, which are provided for supporting the grooves or projections of the polycrystalline rods, have upwardly convex top surfaces.

* * * * *